United States Patent
Shi et al.

(10) Patent No.: US 7,829,915 B2
(45) Date of Patent: Nov. 9, 2010

(54) AVALANCHE PHOTODIODE

(75) Inventors: Jin-Wei Shi, Taoyuan County (TW);
Yen-Hsiang Wu, Taoyuan County (TW)

(73) Assignee: National Central University, Taoyuan (TW)

( * ) Notice: Subject to any disclaimer, the term of this patent is extended or adjusted under 35 U.S.C. 154(b) by 321 days.

(21) Appl. No.: 12/187,525

(22) Filed: Aug. 7, 2008

(65) Prior Publication Data

US 2009/0315073 A1    Dec. 24, 2009

(30) Foreign Application Priority Data

Jun. 19, 2008    (TW) ............................... 97122954 A

(51) Int. Cl.
*H01L 21/00* (2006.01)

(52) U.S. Cl. ........................ 257/186; 257/188; 257/436; 257/438; 257/458; 257/466; 257/E27.122; 257/E31.061; 257/E31.063; 257/E31.067

(58) Field of Classification Search ......... 257/186–188, 257/429–466, E27.122, 31.061–67
See application file for complete search history.

(56) References Cited

U.S. PATENT DOCUMENTS

| | | | | |
|---|---|---|---|---|
| 4,599,632 A | * | 7/1986 | Bethea et al. | 257/186 |
| 5,818,096 A | * | 10/1998 | Ishibashi et al. | 257/458 |
| 6,720,588 B2 | * | 4/2004 | Vickers | 257/186 |
| 7,045,833 B2 | * | 5/2006 | Campbell et al. | 257/186 |
| 7,557,387 B2 | * | 7/2009 | Ishibashi et al. | 257/186 |
| 2008/0230862 A1 | * | 9/2008 | Singh | 257/436 |
| 2009/0008738 A1 | * | 1/2009 | Yuan et al. | 257/438 |

* cited by examiner

*Primary Examiner*—Michael S Lebentritt
(74) *Attorney, Agent, or Firm*—Jackson IPG PLLC; Demlan K. Jackson

(57) ABSTRACT

The present invention changes layer polarities of an epitaxy structure of an avalanche photodiode into n-i-n-i-p. A transport layer is deposed above an absorption layer to prevent absorbing photon and producing electrons and holes. A major part of electric field is concentrated on a multiplication layer for producing avalanche and a minor part of the electric field is left on the absorption layer for transferring carrier without avalanche. Thus, bandwidth limit from a conflict between RC bandwidth and carrier transferring time is relieved. Meanwhile, active area is enlarged and alignment error is improved without sacrificing component velocity too much.

18 Claims, 8 Drawing Sheets

AVALANCHE PHOTODIODE

FIELD OF THE INVENTION

The present invention relates to a photodiode; more particularly, relates to changing doping polarity and to avalanching with hole for high speed fiber communication.

DESCRIPTION OF THE RELATED ART

Following the development of fiber communication, 10 giga-bit per second (Gbit/sec) avalanche photodiode is replacing 2.5 Gbit/sec avalanche photodiode. Traditional avalanche photodiode has a multiplication layer of InP. Yet, its avalanche usually happens in a Zn diffusion region, so a complicated Zn diffusion region is required to obtain a good avalanche performance. As shown in FIG. 6 and FIG. 7, two avalanche photodiode having a multiplication layer of InAlAs are proposed by Prof. Joe C. Campbell and Mitsubishi Electric Corp. In FIG. 6, the avalanche photodiode has an epitaxial structure 2 of a passivation film 21, a Zn diffusion region 22, an undoped InP window layer 23, a InAlGaAs grading layer 24, a InGaAs absorption layer 25, a p-type field control layer 26, a InAlAs multiplication layer 27 and an n-type distributed Bragg reflector layer 28, where the epitaxial structure 2 is grown on a n-type doped InP semiconductor substrate, has a p-i-p-i-n junction and comprises an anode 30 and a cathode 31. Although the photodiodes shorten a delay time of the avalanche, thick InGaAs absorption layers 25 are required to obtain enough response and low capacitance. However, when operated in a low gain (M=10), component bandwidth is dominated by a transferring time of a secondary hole for crossing the absorption layer 25. As shown in FIG. 7, hole from the multiplication layer has to pass through the thick absorption layer for drifting back to p-type electrode, which seriously limits bandwidth of drift time. On the contrary, if a thin absorption layer is obtained to reduce the transferring time of the secondary hole, not only responsibility is sacrificed but also component size has to be small for small capacitance with the same velocity. At the same time, alignment error is seriously sacrificed too.

In a word, since traditional 10 Gbit/sec avalanche photodiode has a major bandwidth on a secondary hole transferring time when operated with a low gain, the absorption layer cannot become thinner for shortening transferring distance and enhancing velocity. Hence, the prior art does not fulfill all users' requests on actual use.

SUMMARY OF THE INVENTION

The main purpose of the present invention is to relieve a bandwidth limit from a conflict between RC bandwidth and carrier transferring time and to en large an active area and improve alignment error without sacrificing component velocity.

The second purpose of the present invention is to change doping polarity of an epitaxy structure into n-i-n-i-p from top to bottom and add a transport layer of InP above an absorption layer for preventing absorbing photon and producing electrons and holes; and to concentrate a major part of electric field on a multiplication layer for producing avalanche and a minor part of the electric field on the absorption layer for transferring carrier without avalanche and further effectively reducing capacitance.

The third purpose of the present invention is to domain transferring time of inner carrier with an electron emission time by changing doping polarity for effectively relieving bandwidth limit, to improve alignment error without sacrificing component velocity, to improve component velocity at the same size, and to save fabrication complexity.

To achieve the above purposes, the present invention is an avalanche photodiode, from top to bottom comprising an epitaxial structure of an n-type ohmic contact layer, a transport layer, a first graded bandgap layer, an absorption layer, a second graded bandgap layer, an n-type charge layer, a multiplication layer and a p-type ohmic contact layer, where the epitaxial structure thus obtains an n-i-n-i-p junction and is grown on a semi-insulating or conductive semiconductor substrate; the n-type ohmic contact layer is made of an n$^+$-type doped semiconductor and is grown on the transport layer to be an n-type electrode; an n-type metal conductive layer is further obtained on the n-type ohmic contact layer; each of the transport layer, the first graded bandgap layer, the absorption layer and the second graded bandgap layer is made of an undoped semiconductor or an n--type doped semiconductor; the transport layer is grown on the first graded bandgap layer to reduce capacitance; the first graded bandgap layer is grown on the absorption layer to change a wide energy gap into a narrow energy gap; the absorption layer is grown on the second graded bandgap layer to absorb incident light to obtain carrier; the second graded bandgap layer is grown on the n-type charge layer to change a narrow energy gap into a wide energy gap; the n-type charge layer is made of an n+-type doped semiconductor and is grown on the multiplication layer to concentrate electric field on the multiplication layer; the multiplication layer is made of an undoped semiconductor and is grown on the p-type ohmic contact layer to amplify a current by accepting the carrier; the p-type ohmic contact layer is made of a p+-type doped semiconductor and is grown on the semiconductor substrate to be a p-type electrode; a p-type metal conductive layer is further obtained on the p-type ohmic contact layer; and the n-type metal conductive layer and the p-type metal conductive layer are connected to the absorption layer and the multiplication layer for conductivity. Accordingly, a novel avalanche photodiode is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

Figure 1:
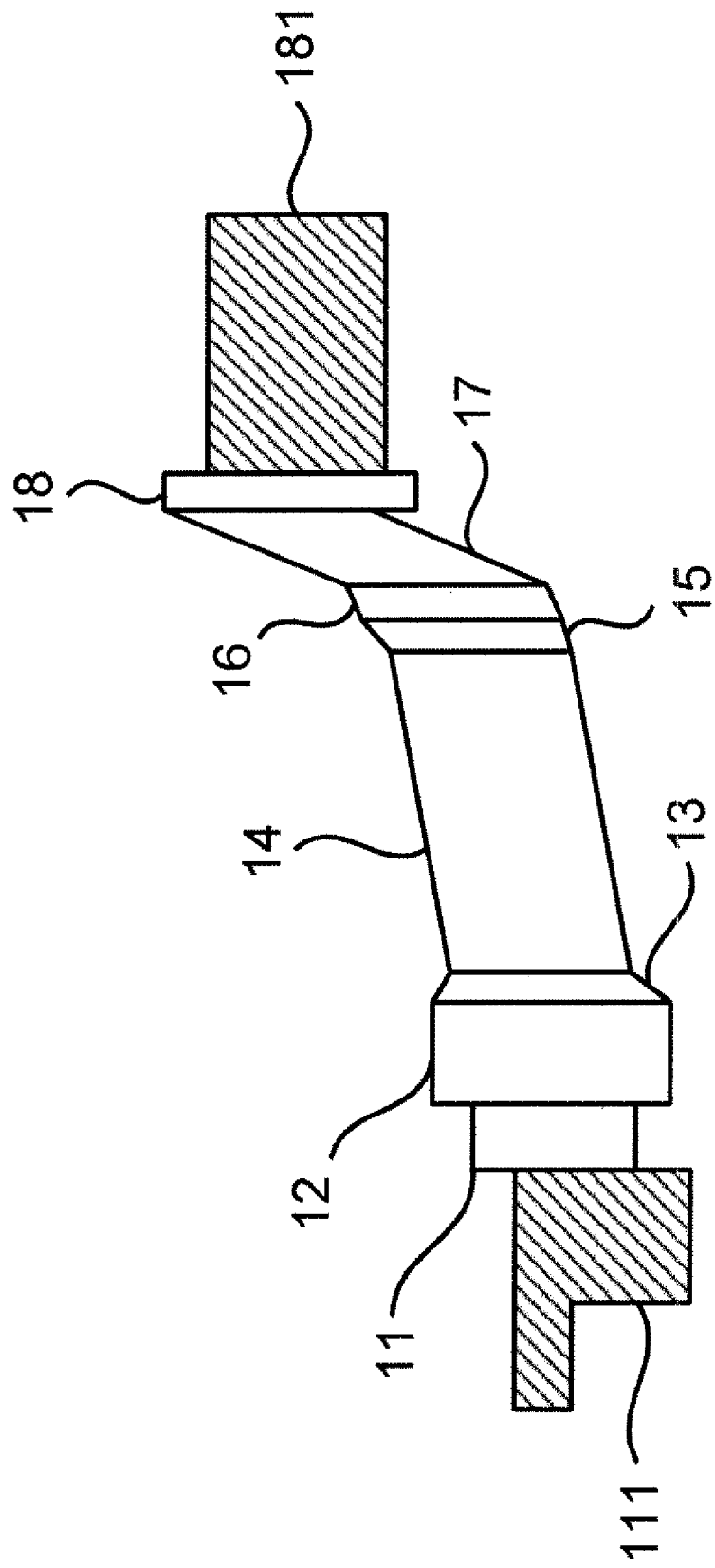
FIG. 1 is the view showing the energy band of the first preferred embodiment according to the present invention.
Figure 2:
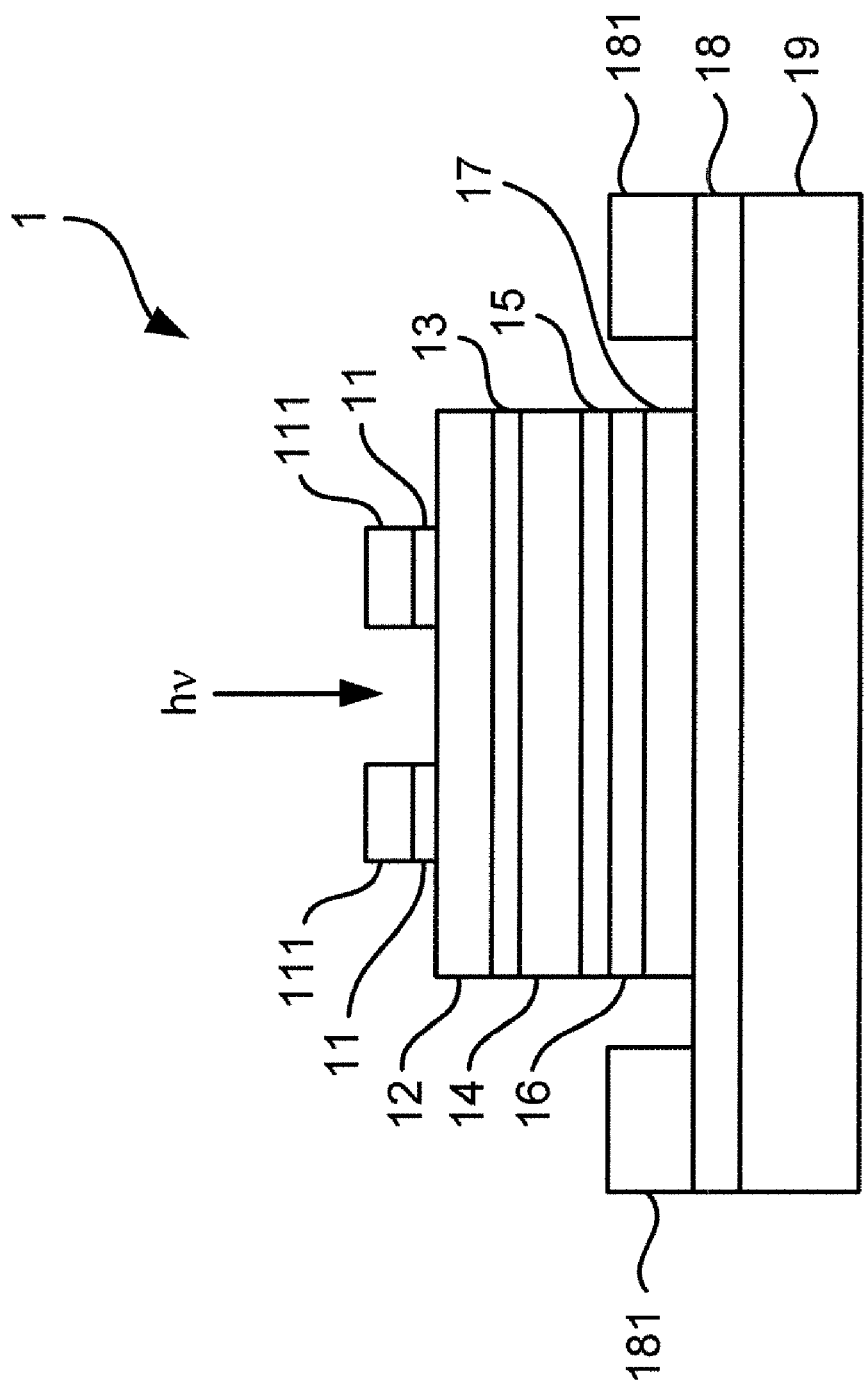
FIG. 2 is the sectional view showing the first preferred embodiment.

The following description of the preferred embodiment is provided to understand the features and the structures of the present invention.

Please refer to FIG. 1 to FIG. 4B, which are a view showing energy band of a first preferred embodiment according to the present invention; sectional views showing a first and a second preferred embodiments; and views showing electron velocity and hole velocity. As shown in the figures, the present invention is an avalanche photodiode, from top to bottom comprising an epitaxial structure 1 of an n-type ohmic contact layer 11, a transport layer 12, a first graded bandgap layer 13, an absorption layer 14, a second graded bandgap layer 15, an n-type charge layer 16, a multiplication layer 17 and a p-type ohmic contact layer 18, where the epitaxial structure 1 thus obtains an n-i-n-i-p junction and is grown on a semi-insulating or conductive semiconductor substrate; and the present invention may further comprises an n-type metal conductive layer 111 and a p-type metal conductive layer 181 to connect the absorption layer 14 and the multiplication layer 17.

Figure 3:
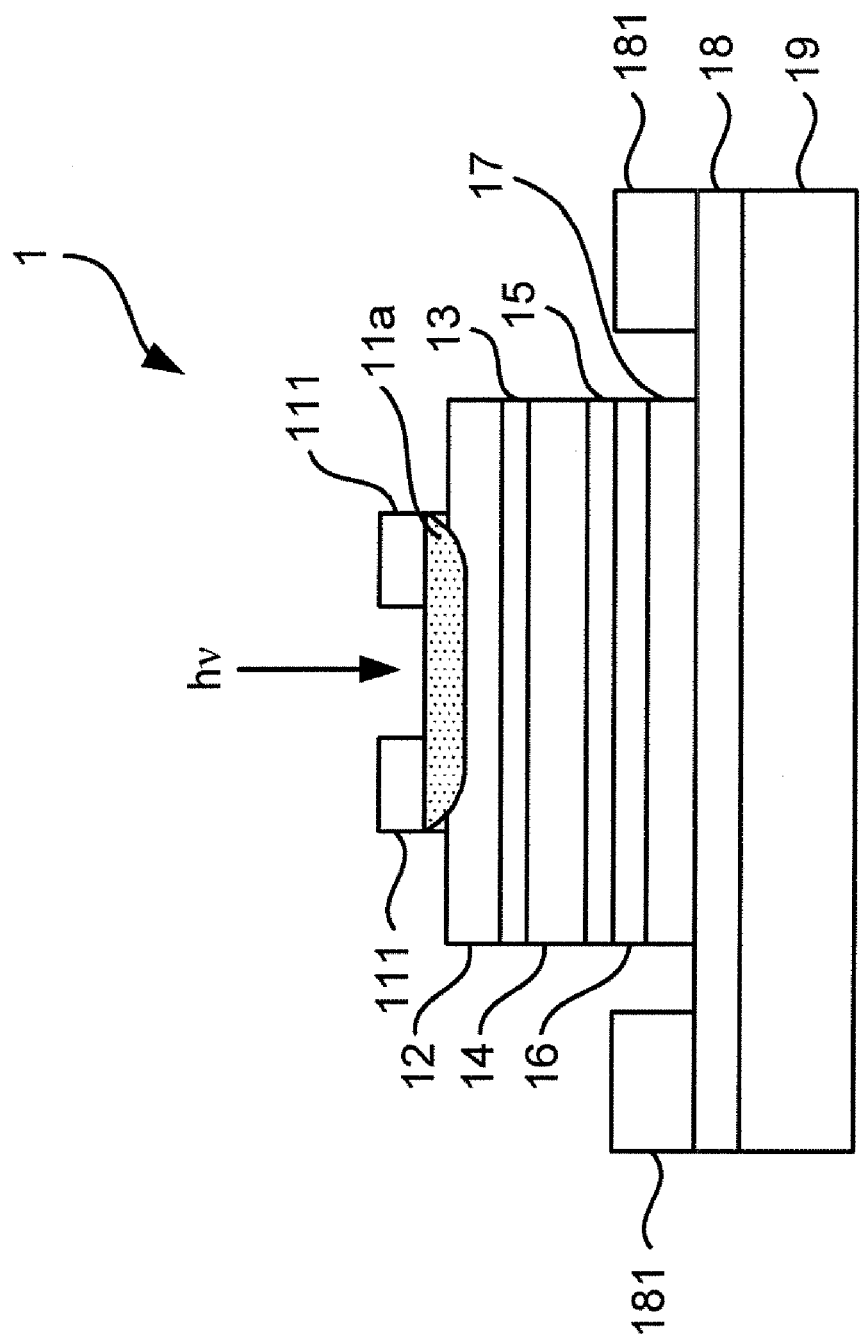
FIG. 3 is the sectional view showing the second preferred embodiment.
Figure 4A:
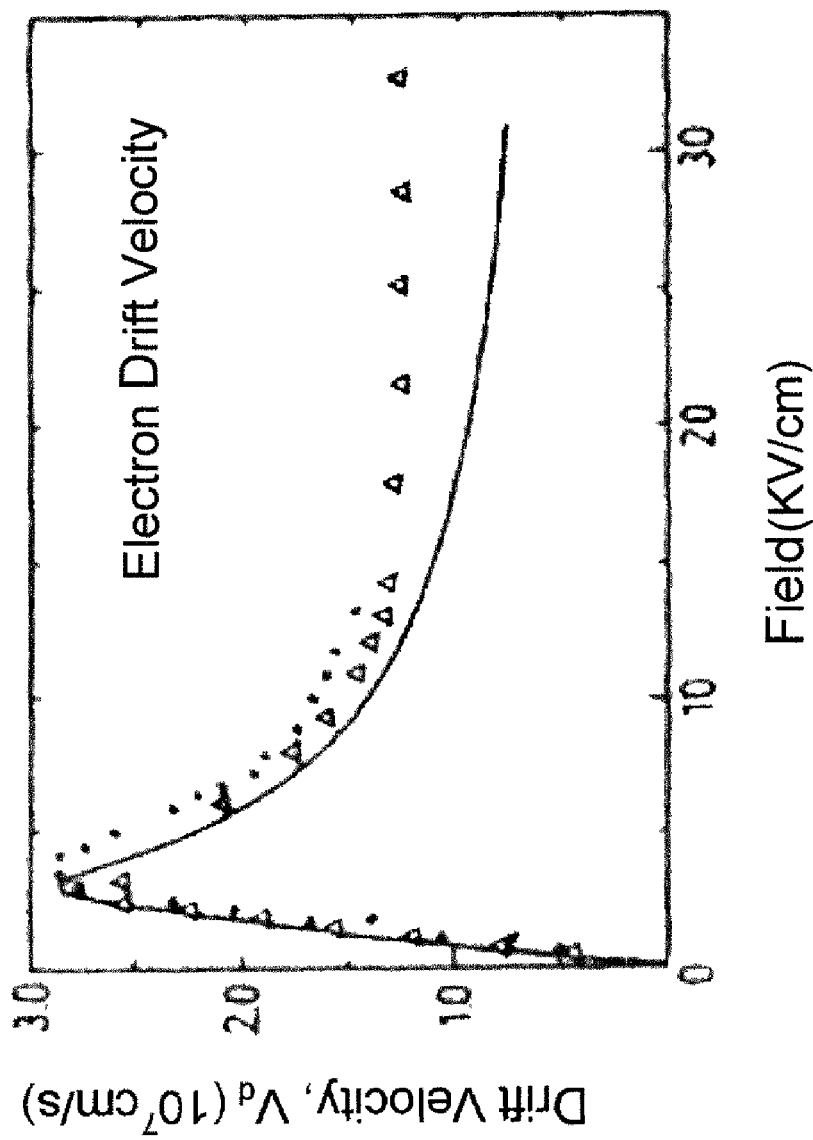
FIG. 4A is the view showing the electron velocity.
Figure 4B:
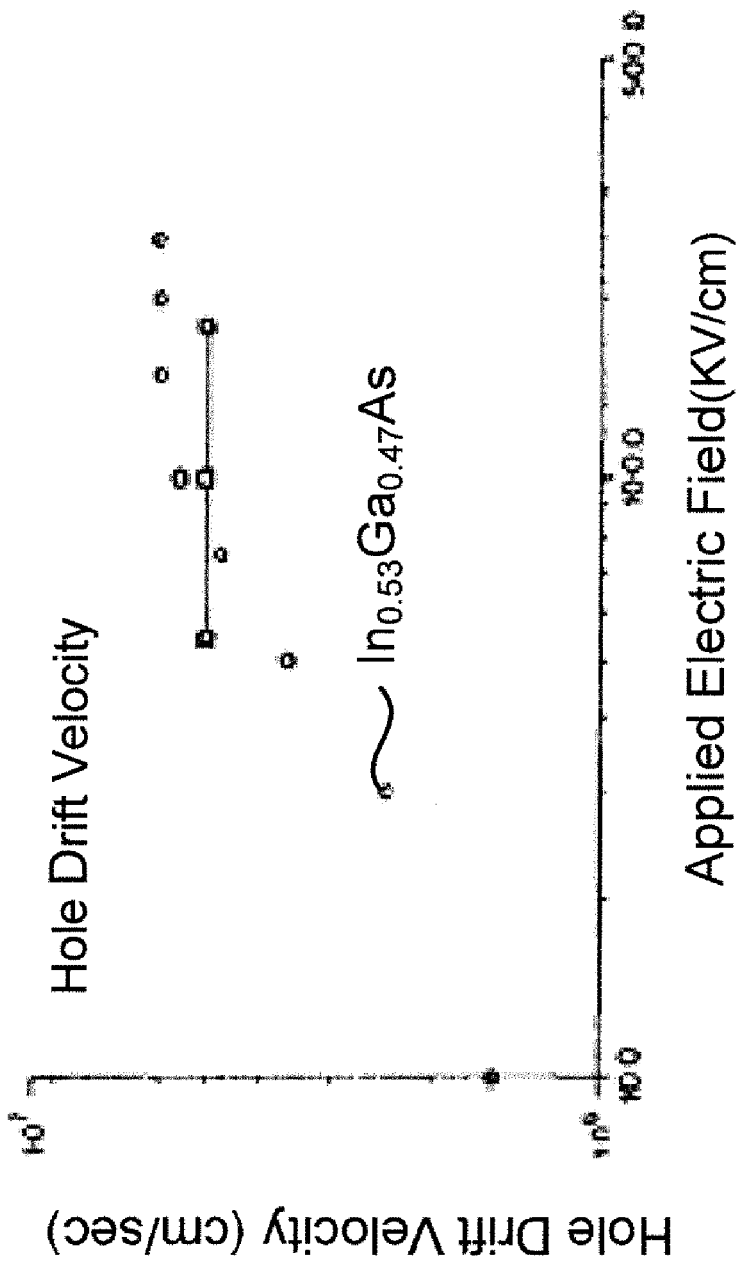
FIG. 4B is the view showing the hole velocity.

The n-type ohmic contact layer 11 is made of an $n^+$-type doped semiconductor and is grown on the transport layer 12 to be an n-type electrode, where the n-type metal conductive layer 111 is formed on the n-type ohmic contact layer 11 through crystal growth, ion implantation or ion diffusion. The n-type ohmic contact layer 11 can be directly formed on a part of a surface of the transport layer 12 through ion implantation or ion diffusion; and the n-type ohmic contact layer 11 can be a Zn diffusion contact layer 11a (as shown in FIG. 3).

The transport layer 12 is made of an undoped or $n^-$-type doped semiconductor and is grown on the first graded bandgap layer 13 to reduce capacitance, where the transport layer 12 has a bandgap wide enough to prevent absorbing photon and producing electrons and holes.

The first graded bandgap layer 13 is made of an undoped or $n^-$-type doped semiconductor and is grown on the absorption layer 14 to turn a wide energy gap into a narrow energy gap.

The absorption layer 14 is made of an undoped or $n^-$-type doped semiconductor and is grown on the second graded bandgap layer 15 to absorb incident light for obtaining carrier.

The second graded bandgap layer is made of an undoped or $n^-$-type doped semiconductor and is grown on the n-type charge layer 16 to turn a narrow energy gap into a wide energy gap.

The n-type charge layer 16 is made of an $n^+$-type doped semiconductor and is grown on the multiplication layer 17 to concentrate electric field on the multiplication layer 17.

The multiplication layer 17 is made of an undoped semiconductor and is grown on the p-type ohmic contact layer 18 to amplify a current by accepting the carrier.

The p-type ohmic contact layer 18 is made of a $p^+$-type doped semiconductor and is grown on the semiconductor substrate 19 to be a p-type electrode, where the p-type metal conductive layer 181 can be formed on the p-type ohmic contact layer 18.

The semiconductor substrate 16 is made of a semiconductor of a compound, such as GaAs, GaSb, InP or GaN; or a semiconductor of an IV-group element, such as Si. The n-type ohmic contact layer 11, the transport layer 12, the first and the second graded bandgap layers 13, 15, the n-type charge layer 16 and the multiplication layer 17 are made of non-photoabsorptive materials. The whole epitaxial structure 1 is obtained with a heterojunction of compound semiconductors and alloy semiconductors, such as InP/InGaAsP/InAlGaAs/InAlAs. In the epitaxial structure 1, the absorption layer 14 has a narrowest width of bandgap; and the multiplication layer 17 and the n-type charge layer 16 have widest widths of bandgap. Thus, with the above structure, a novel avalanche photodiode is obtained.

The epitaxial structure 1 is grown on the semiconductor substrate 19 through an epitaxy growth method, where molecular beam epitaxy (MBE), metalorganic chemical vapor deposition (MOCVD) and hydride vapor phase epitaxy (HVPE) are preferred methods.

In an instance, the layers in the epitaxial structure 1 include the n-type ohmic contact layer 11 made of $n^+$-type doped InGaAsP or the Zn diffusion contact layer 11a made of doped Si; the transport layer 12 made of undoped InP; the first graded bandgap layer and the second graded bandgap layer 13, 15 made of undoped InAlGaAs; the absorption layer 14 made of undoped InGaAs; the n-type charge layer 16 made of $n^+$-type doped InAlAs; the multiplication layer 17 made of undoped InAlAs; and the p-type ohmic contact layer 18 made of $p^+$-type InGaAsP. Thus, a doping sequence of n-i-n-i-p is obtained, where the transport layer 14 of InP deposed above the absorption layer 12 has a width wide enough to prevent absorbing photon and producing electrons and holes. By controlling a density and a width of the n-type charge layer, the n-type charge layer 16 concentrates a major part of the electric field on the multiplication layer for producing avalanche; and a minor part of the electric field are left on the absorption layer for transferring carrier without avalanche. Thus, capacitance is effectively reduced without sacrificing carrier transferring time too much. Consequently, by changing doping polarity components are triggered by hole inside; and a secondary electron emission time thus becomes a domain factor of bandwidths of the components where bandwidth limit is effectively relieved. For example, with an absorption layer of $In_{0.53}Ga_{0.47}As$, saturation of electron velocity (shown in FIG. 4A) is about five times to saturation of hole velocity (shown in FIG. 4B). Hence, the present invention has a short carrier transferring time and a high component velocity.

In another instance, the layers in the epitaxial structure 1 include the n-type ohmic contact layer 11 made of $n^+$-type doped InGaAsP; the transport layer 12 made of $n^-$-type doped InP; the first graded bandgap layer and the second graded bandgap layer 13, 15 made of $n^-$-type doped InAlGaAs; the absorption layer 14 made of $n^-$type doped InGaAs; the n-type charge layer 16 made of $n^+$-type doped InAlAs; the multiplication layer 17 made of undoped InAlAs; and the p-type ohmic contact layer 18 made of $p^+$-type doped InGaAsP.

Figure 5:
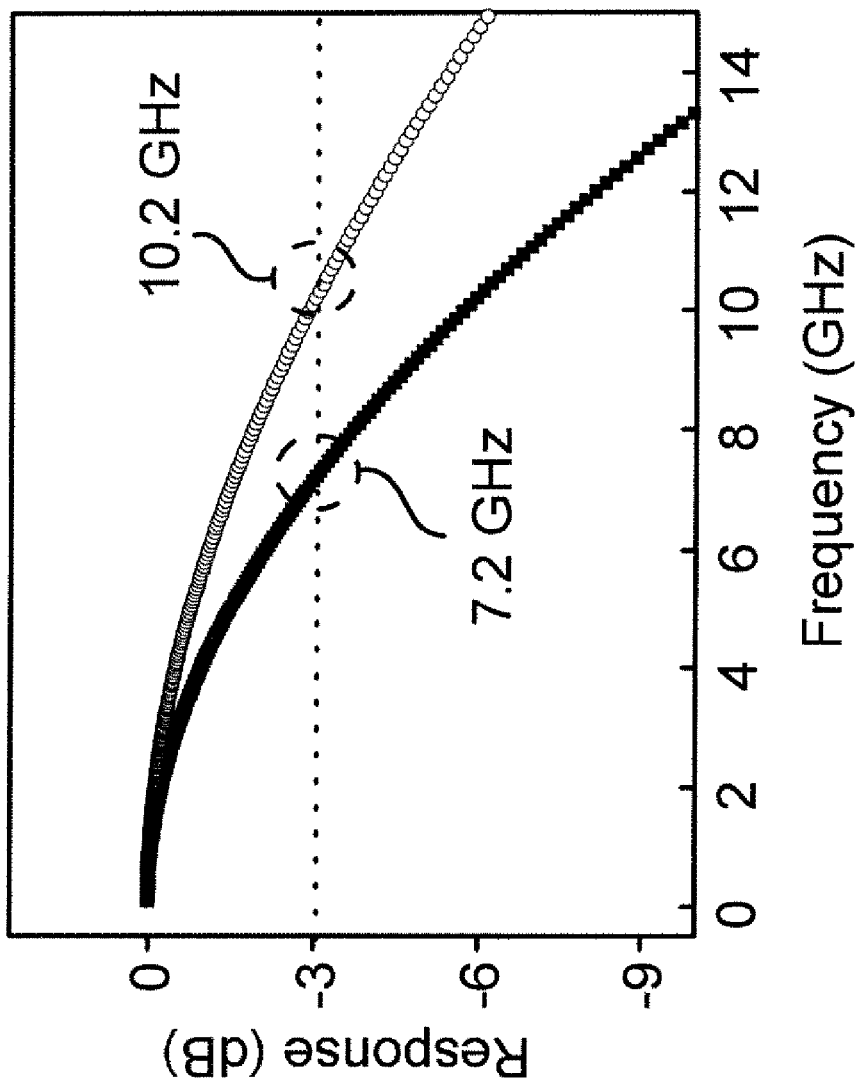
FIG. 5 is the view showing the frequency response.
Figure 6:
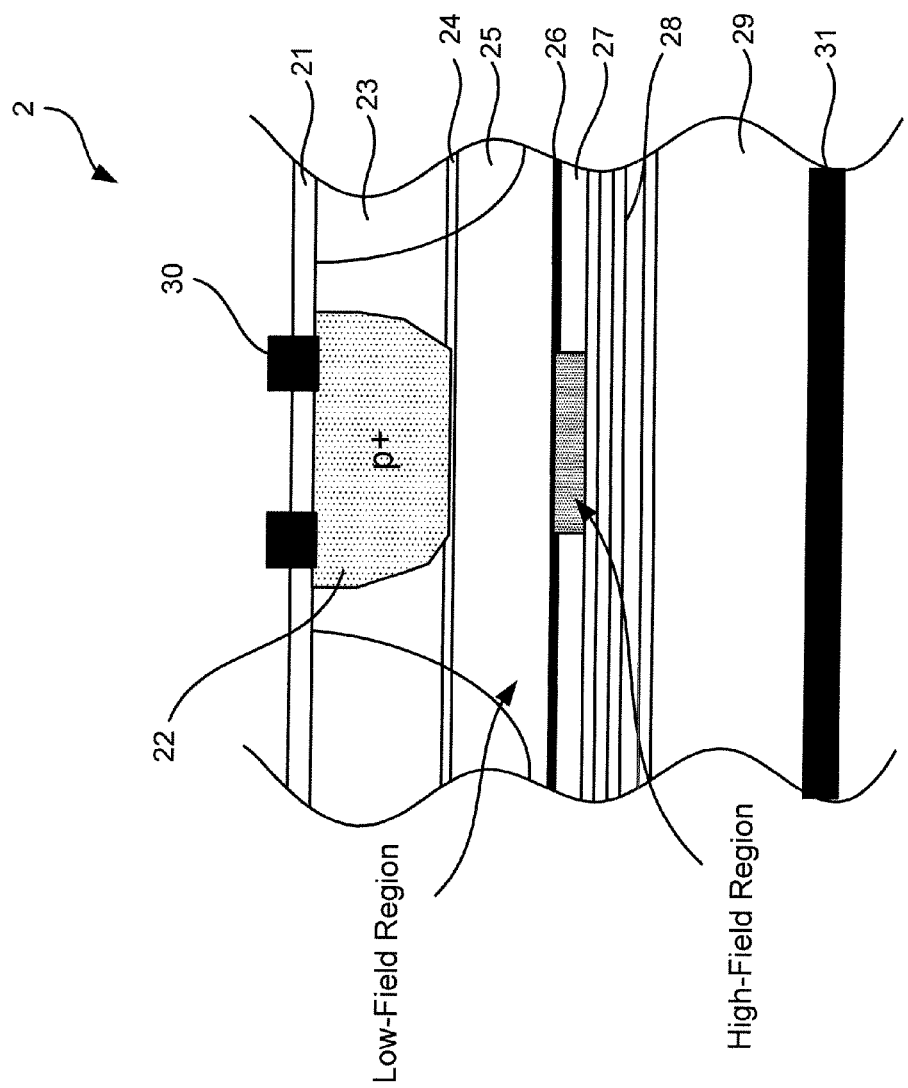
FIG. 6 is the view of the first prior art.
Figure 7:
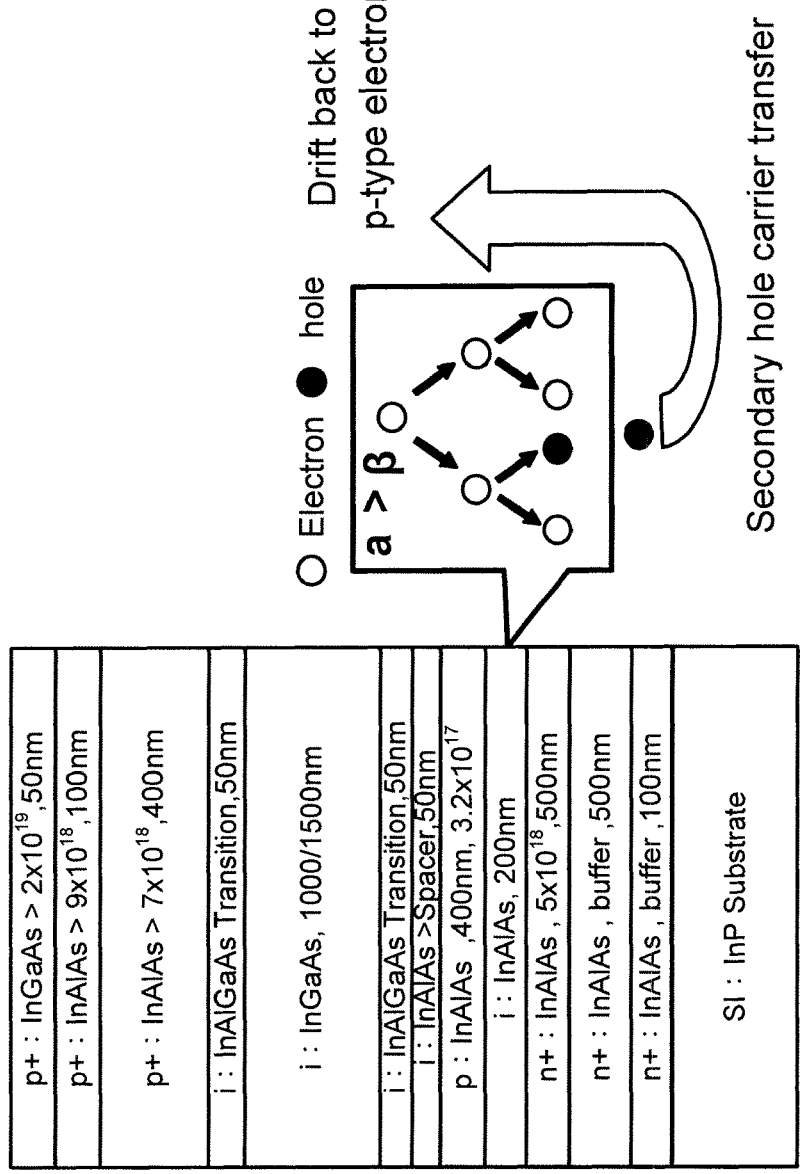
FIG. 7 is the view of the second prior art.

Please refer to FIG. 5, which is a view showing a frequency response. As shown in the figure, a preferred embodiment has an active area with a diameter about 50 meters (m); an absorption layer with a thickness about 1.5 m; a multiplication layer with a thickness about 200 nanometers (nm); and a charge layer with a thickness about 150 nm, where a transport layer of InP with a thickness about 600 nm is deposed upon the absorption layer to reduce capacitance. Thus, the preferred embodiment has a bandwidth increased from 7.2 giga-hertz (GHz) to 10.2 GHz).

Thus, the present invention changes a doped polarity of a multiplication layer and further adds a depletive transport layer of carrier in an epitaxial structure, where carrier transferring time is dominated by electron transferring time and, furthermore, a bandwidth limit from a conflict between resistance-capacitance (RC) bandwidth and carrier transferring time is relieved. Thus, deterioration problems from enlarged active area and thickened depletion area are solved. Furthermore, without sacrificing component velocity too much, the present invention maintains almost the same velocity with a bigger active area to improve alignment error; and, the present invention greatly elevates velocity limit of an avalanche photodiode. Conclusively, the present invention has the following advantages: (1) alignment error is solved without complicated components; (2) component has an improved performance in velocity with the same size; and (3) there is no fabrication complexity added.

To sum up, the present invention is an avalanche photodiode, where, by changing doping polarity and avalanching with hole, a bandwidth limit from a conflict between RC bandwidth and carrier transferring time is relieved and, without sacrificing component velocity too much, an active area is enlarged and an alignment error is improved.

The preferred embodiment herein disclosed is not intended to unnecessarily limit the scope of the invention. Therefore,

What is claimed is:

1. An avalanche photodiode, comprising
an n-type ohmic contact layer;
a transport layer;
a first graded bandgap layer;
an absorption layer;
a second graded bandgap layer;
an n-type charge layer;
a multiplication layer; and
a p-type ohmic contact layer,
wherein, from top to bottom, said avalanche photodiode comprises said n-type ohmic contact layer, said transport layer, said first graded bandgap layer, said absorption layer, said second graded bandgap layer, said n-type charge layer, said multiplication layer and said p-type ohmic contact layer, and said avalanche photodiode thus obtains an epitaxial structure having an n-i-n-i-p junction;
wherein said epitaxial structure of said avalanche photodiode is grown on a diode substrate;
wherein said n-type ohmic contact layer is made of an $n^+$-type doped semiconductor and is grown on said transport layer to be an n-type electrode;
wherein each of said transport layer, said first graded bandgap layer, said absorption layer and said second graded bandgap layer is made of a semiconductor selected from a group consisting of an undoped semiconductor and an $n^-$-type doped semiconductor;
wherein said transport layer is grown on said first graded bandgap layer to reduce capacitance;
wherein said first graded bandgap layer is grown on said absorption layer to change a wide energy gap into a narrow energy gap;
wherein said absorption layer is grown on said second graded bandgap layer to absorb incident light to obtain carrier;
wherein said second graded bandgap layer is grown on said n-type charge layer to change a narrow energy gap in to a wide energy gap;
wherein said n-type charge layer is made of an $n^+$-type doped semiconductor and is grown on said multiplication layer to concentrate electric field on said multiplication layer;
wherein said multiplication layer is made of an undoped semiconductor and is grown on said p-type ohmic contact layer to amplify a current by accepting said carrier;
wherein said p-type ohmic contact layer is made of a $p^+$-type doped semiconductor and is grown on said semiconductor substrate to be a p-type electrode; and
wherein said semiconductor substrate is selected from a group consisting of a semi-insulating substrate and a conductive substrate.

2. The photodiode according to claim 1,
wherein an n-type metal conductive layer is further obtained on said n-type ohmic contact layer.

3. The photodiode according to claim 1,
wherein a p-type metal conductive layer is further obtained on said p-type ohmic contact layer.

4. The photodiode according to claim 1,
wherein said epitaxial structure is obtained with a heterojunction of compound semiconductors and alloy semiconductors.

5. The photodiode according to claim 4,
wherein said heterojunction is InP/InGaAsP/InAlGaAs/InAlAs.

6. The photodiode according to claim 1,
wherein said semiconductor substrate is made of a semiconductor of a material selected from a group consisting of a compound and an IV-group element.

7. The photodiode according to claim 6,
wherein said compound is selected from a group consisting of GaAs, GaSb, InP and GaN.

8. The photodiode according to claim 6,
wherein said IV-group element is Si.

9. The photodiode according to claim 1,
wherein said n-type ohmic contact layer is obtained through a method selected from a group consisting of crystal growth, ion implantation and ion diffusion.

10. The photodiode according to claim 1,
wherein said n-type ohmic contact layer is directly obtained on a part area of a surface of said transport layer through a method selected from a group consisting of ion implantation and ion diffusion.

11. The photodiode according to claim 1,
wherein said n-type ohmic contact layer, said transport layer, said first graded bandgap layer, said second graded bandgap layer, said n-type charge layer and said multiplication layer are made of non-photoabsorptive materials.

12. The photodiode according to claim 1,
wherein said absorption layer has a narrowest width of bandgap in said photodiode.

13. The photodiode according to claim 1,
wherein said multiplication layer and said n-type charge layer have widest widths of bandgap in said photodiode.

14. The photodiode according to claim 1,
wherein said transport layer has a bandgap width to prevent absorbing photon and producing electrons and holes.

15. The photodiode according to claim 1,
wherein, by controlling a density and a width of said n-type charge layer, said n-type charge layer concentrates a major part of said electric field on said multiplication layer and a minor part of said electric field are left on said absorption layer.

16. The photodiode according to claim 1,
wherein said epitaxial structure is grown on said semiconductor substrate through a method selected from a group consisting of molecular beam epitaxy (MBE), metalorganic chemical vapor deposition (MOCVD) and hydride vapor phase epitaxy (HVPE).

17. The photodiode according to claim 1,
wherein said n-type ohmic contact layer is made of $n^+$-type doped InGaAsP, said transport layer is made of undoped InP, said first graded bandgap layer and said second graded bandgap layer are made of undoped InAlGaAs, said absorption layer is made of undoped InGaAs, said n-type charge layer is made of $n^+$-type doped InAlAs, said multiplication layer is made of undoped InAlAs, and said p-type ohmic contact layer is made of $p^+$-type doped InGaAsP.

18. The photodiode according to claim 1,
wherein said n-type ohmic contact layer is made of $n^+$-type InGaAsP, said transport layer is made of $n^-$-type InP, said first graded bandgap layer and said second graded bandgap layer are made of $n^-$-type InAlGaAs, said absorption layer is made of $n^-$-type InGaAs, said n-type charge layer is made of $n^+$-type InAlAs, said multiplication layer is made of undoped InAlAs, and said p-type ohmic contact layer is made of $p^+$-type InGaAsP.

* * * * *